(12) United States Patent
Chen et al.

(10) Patent No.: US 7,612,414 B2
(45) Date of Patent: Nov. 3, 2009

(54) OVERLAPPED STRESSED LINERS FOR IMPROVED CONTACTS

(75) Inventors: Xiangdong Chen, Poughquag, NY (US); Jun Jung Kim, Paju (KR); Young Gun Ko, Kyunggi-do (KR); Jae-Eun Park, Fishkill, NY (US); Haining S. Yang, Wappingers Falls, NY (US)

(73) Assignees: International Business Machines Corporation, Armonk, NY (US); Samsung Electronics Co., Ltd. (KR)

( * ) Notice: Subject to any disclaimer, the term of this patent is extended or adjusted under 35 U.S.C. 154(b) by 179 days.

(21) Appl. No.: 11/693,254

(22) Filed: Mar. 29, 2007

(65) Prior Publication Data
US 2008/0237737 A1 Oct. 2, 2008

(51) Int. Cl.
*H01L 21/8238* (2006.01)
*H01L 23/18* (2006.01)

(52) U.S. Cl. .............. 257/369; 257/346; 257/372; 257/E21.205; 257/E21; 257/626; 257/E21.64

(58) Field of Classification Search ........... 257/382, 257/E2.792, E21.293, 346, 369, 372, E21.205, 257/E21.626, E21.64; 438/230
See application file for complete search history.

(56) References Cited

U.S. PATENT DOCUMENTS

2005/0106844 A1* 5/2005 Tung et al. ............... 438/527
2005/0260810 A1* 11/2005 Cheng et al. ............. 438/199

* cited by examiner

*Primary Examiner*—Ngan Ngo
*Assistant Examiner*—Benjamin Tzu-Hung Liu
(74) *Attorney, Agent, or Firm*—Yuanmin Cai; Daryl K. Neff

(57) ABSTRACT

A semiconductor structure is provided which includes a first semiconductor device in a first active semiconductor region and a second semiconductor device in a second active semiconductor region. A first dielectric liner overlies the first semiconductor device and a second dielectric liner overlies the second semiconductor device, with the second dielectric liner overlapping the first dielectric liner at an overlap region. The second dielectric liner has a first portion having a first thickness contacting an apex of the second gate conductor and a second portion extending from peripheral edges of the second gate conductor which has a second thickness substantially greater than the first thickness. A first conductive via contacts at least one of the first or second gate conductors and the conductive via extends through the first and second dielectric liners at the overlap region. A second conductive via may contact at least one of a source region or a drain region of the second semiconductor device.

11 Claims, 7 Drawing Sheets

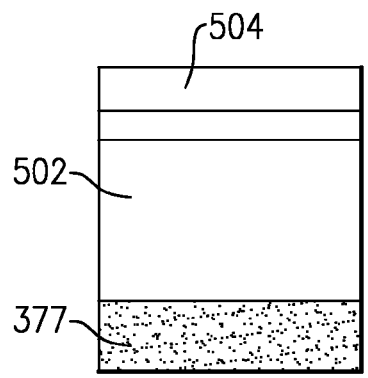
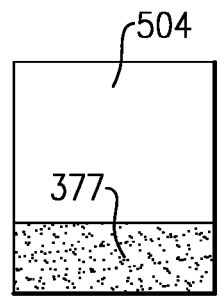
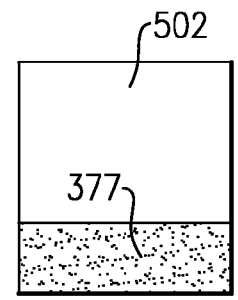
FIG.16A          FIG.16B          FIG.16C
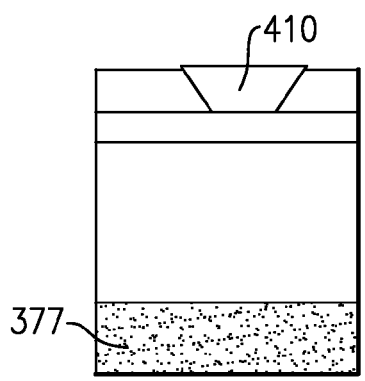
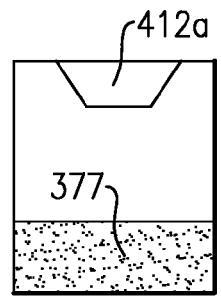
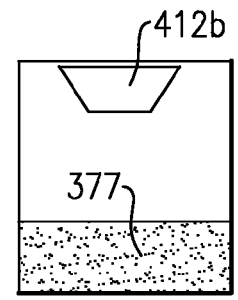
FIG.17A          FIG.17B          FIG.17C
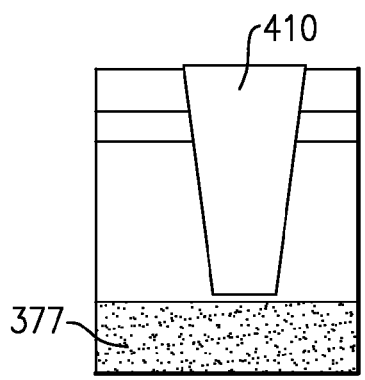
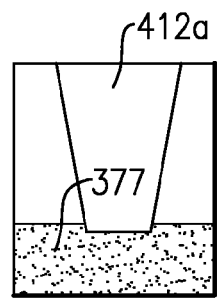
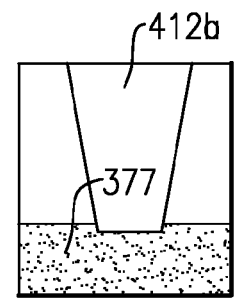
FIG.18A          FIG.18B          FIG.18C

OVERLAPPED STRESSED LINERS FOR IMPROVED CONTACTS

FIELD OF THE INVENTION

The present invention relates to the structure and fabrication of semiconductor devices.

BACKGROUND OF THE INVENTION

In fabricating field effect transistors ("FETs") in semiconductor wafers, source and drain regions are implanted which have p-type or n-type conductivity. However, for complementary metal oxide semiconductor (CMOS) devices, source and drain regions are implanted with a p-type dopant to form p-type FETs ("PFETs"), and source and drain regions are implanted with an n-type dopant to form n-type FETs ("NFETs"). It has been demonstrated that carrier mobility in a transistor can be increased when a stress of sufficient magnitude is applied to the conduction channel of a transistor to create a beneficial strain therein. An increase in the performance of an n-type field effect transistor (NFET) can be achieved by applying a tensile stress to the conduction channel of the NFET in a longitudinal direction of the conduction channel. An increase in the performance of a p-type field effect transistor (PFET) can be achieved by applying a compressive stress to the conduction channel of the PFET in a longitudinal direction of the conduction channel.

A stress-imparting film, also referred to herein as a "stressed" film, can be deposited to cover a semiconductor device region to impart a stress thereto for enhancing the conductivity of a transistor, for example, an NFET or a PFET device. Silicon nitride is one material, among others, which can be deposited in such way that the resulting material layer imparts either a tensile stress or a compressive stress to a layer of a second material with which it is in contact. To enhance the conductivity of circuits which include both an NFET and a PFET, a tensile stressed silicon nitride layer can be formed to cover an active semiconductor region of the NFET and a compressive stressed silicon nitride layer can be formed to cover an active semiconductor region of the PFET.

From a fabrication point of view, such a goal can be accomplished by forming two films, each having a different internal stress, to overlie the NFET and PFET. In such case, a tensile stressed film 102 can be deposited and patterned to overlie an active semiconductor region 132 in which the NFET is provided, after which a compressive stressed film 104 is deposited and then patterned to overlie another active semiconductor region 134 in which the PFET is provided. Typically, the two stressed films are overlapped at an overlap region 100, as illustrated in FIG. 1. However, overlapped films can create certain problems.

One problem involves forming a conductive via 210 for contacting gate conductors of the NFET and PFET. As seen in FIG. 1, a gate conductor 122 of the NFET and a gate conductor 124 of the PFET are joined together in an overlapped region overlying a trench isolation region 110 of a chip. In one example, the gate conductors can include a polysilicon conductor 225 with an overlying low-resistance layer, such as a layer 227 including a metal or conductive metal compound such as a silicide. The etching of the contact hole in the overlapped region 100 between the two active semiconductor regions can be difficult to perform while etching other contact holes, such as a contact hole 212 in which a contact via to a source region or drain region of the PFET will be formed. The difficulty arises because of the relative differences in thickness between the film 104 where the contact via 212 is formed and the combined thicknesses of the stressed films 102 and 104 through which the contact hole 210 is formed. As apparent from FIG. 1, the combined thicknesses of the stressed films 102, 104 where overlapped at the boundary 220 are much greater than the thickness of the film 104 where the contact via 212 is formed. The difference in the combined thickness of the two films 102, 104 versus the thickness of the one film 102 relative thereto can make it difficult to simultaneously form a contact via to at least one of the gate conductors through contact via 210 and to form a contact via 212 to a source region or a drain region of a transistor, e.g. the PFET.

As seen in FIG. 2, a contact open failure (as shown generally at location 220) can result where the contact via 210 extends through both stressed films 102, 104 at the overlapped region 100 at location 220 where the two stressed films meet over the trench isolation region 110. A contact open failure occurs when there is much higher than normal resistance at the interface between the conductive contact via 210 and the low-resistance layer 227 or polysilicon layer 225 of the gate conductor. A contact open failure can occur when an etching process fails to etch the contact hole fails to a sufficient depth. The problem is more difficult to solve than simply extending the time of etching or increasing the strength of the etchant to increase the depth of the contact hole. When the depth to which the contact hole 210 is etched is extended, "over"-etching of the contact hole 212 (FIG. 1) can occur. As a result, the contact hole 212 may extend too deeply, such that it etches through most or all of the low-resistance layer 277 and into the semiconductor region in which the source region or drain region is provided.

FIG. 3 is a plan view illustrating an alternative arrangement in which a gate conductor 322 of a NFET and a gate conductor 324 of a PFET extend parallel to each other. In this case, the stressed films 302, 304 are overlapped in an overlapped region 300 spaced from each of the two gate conductors. Embodiments of the invention herein are also described in relation to the arrangement illustrated in FIG. 3.

From the foregoing it is apparent that a need exists for a structure and an associated method of fabricating a semiconductor device in which more than one stressed films can be provided, while permitting contact vias to be etched with less difficulty.

SUMMARY OF THE INVENTION

In accordance with an aspect of the invention, a semiconductor structure is provided which includes a first semiconductor device in a first active semiconductor region and a second semiconductor device in a second active semiconductor region. Desirably, the semiconductor structure includes a first gate conductor of the first semiconductor device extending over the first active semiconductor region and a second gate conductor of the second semiconductor device having an end joined to an end of the first gate conductor. The second gate conductor extends over the second active semiconductor region. Desirably, the semiconductor structure further includes a first dielectric liner overlying the first semiconductor device and a second dielectric liner overlying the second semiconductor device. The second dielectric liner may overlap the first dielectric liner at an overlap region such that the second dielectric liner includes a first portion having a first thickness contacting an apex of the second gate conductor and a second portion extending from peripheral edges of the second gate conductor, the second portion having a second thickness substantially greater than the first thickness. A first conductive via contacts at least one of the first or second gate conductors and the conductive via extends through the first and second dielectric liners at the overlap region. A second conductive via may contact at least one of a source region or a drain region of the second semiconductor device.

BRIEF DESCRIPTION OF THE DRAWINGS

FIG. 16A through FIG. 18C are sectional views illustrating stages in the formation of contact holes to the semiconductor device structure in accordance with an embodiment of the invention.

DETAILED DESCRIPTION

Figure 1:
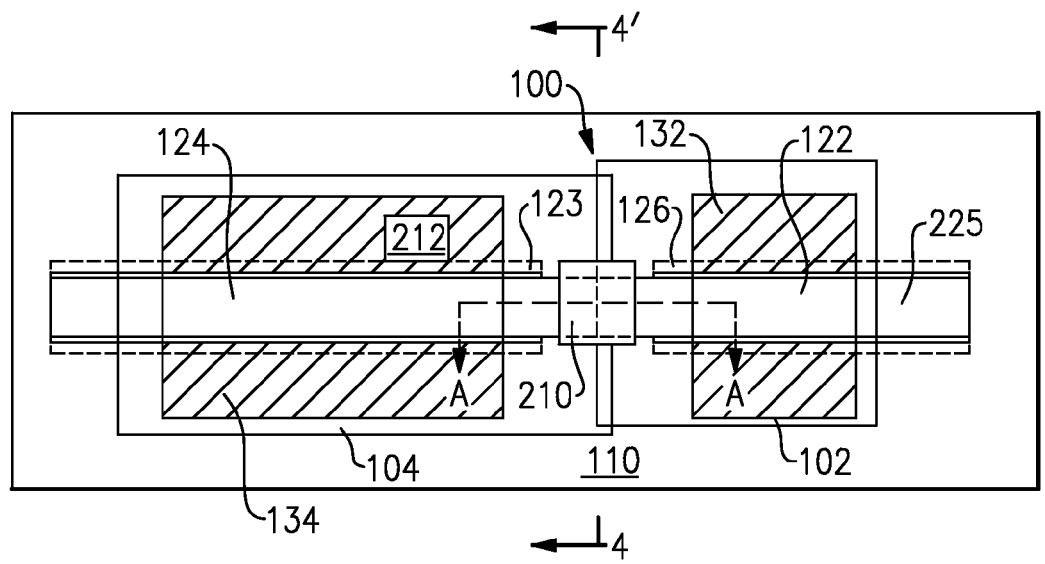
FIG. 1 is a top-down plan view representative of a prior art semiconductor device structure having overlapped stressed dielectric films and conductive contact vias.
Figure 2:
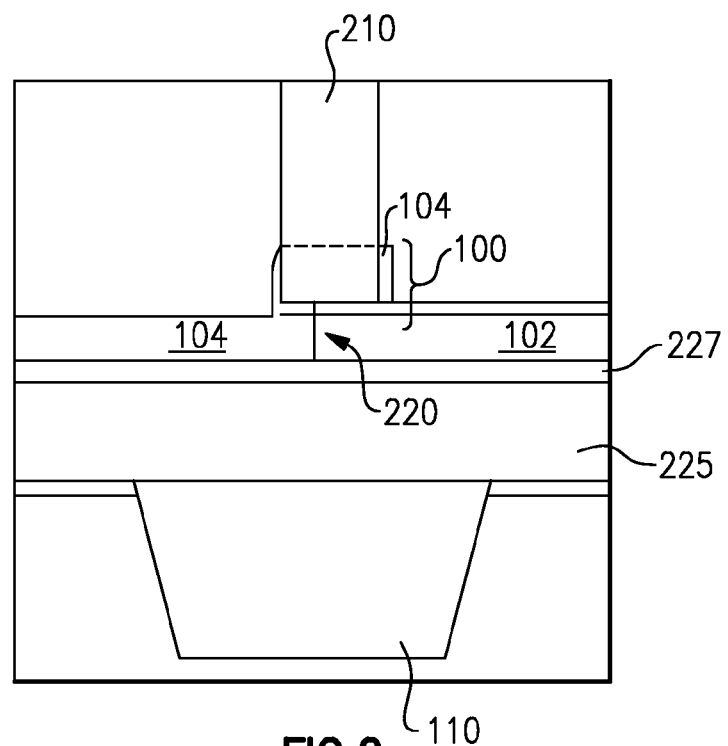
FIG. 2 is a sectional view through line A-A' of the prior art semiconductor device structure shown in FIG. 1.
Figure 4:
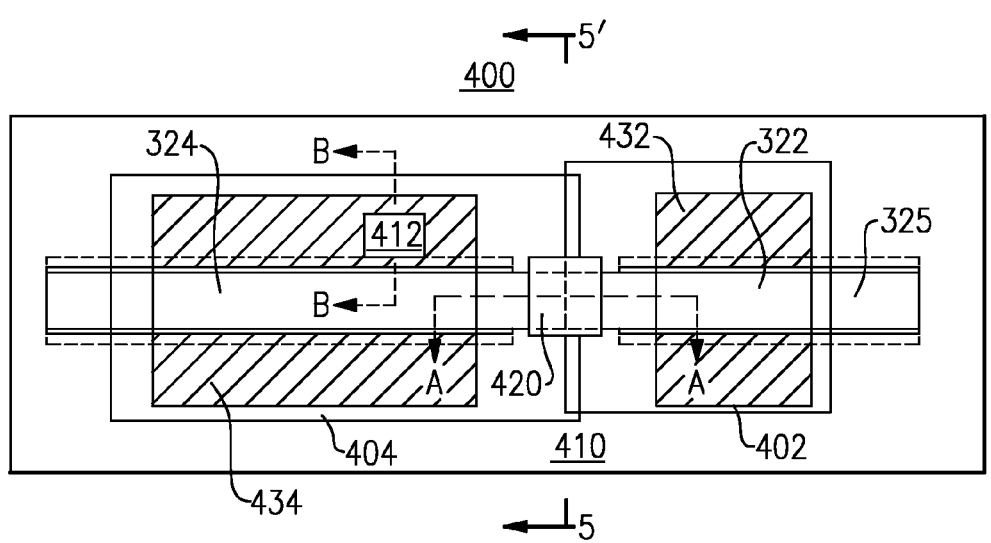
FIG. 4 is a top-down plan view illustrating a semiconductor device structure having overlapped stressed dielectric films and conductive contact vias in accordance with an embodiment of the invention.

Referring to FIG. 4, an embodiment of the invention will now be described. When viewed from the top down, a semiconductor structure 400 according to an embodiment of the invention appears similar to the structure shown in FIG. 1. The locations of active semiconductor regions 432, 434, a trench isolation region 410, gate conductors 322, 324, stressed dielectric liners 402, 404, and contact vias 410, 412 are the same as the locations of corresponding features shown in FIG. 1.

As depicted in the corresponding sectional view (FIG. 5), a gate stack 320 overlying the trench isolation region 110 includes a first gate conductor layer 325 overlying a gate dielectric layer 328, first dielectric spacers 330 contacting sidewalls of the gate conductor and second dielectric spacers 332 overlying the first dielectric spacers. A second gate conductor layer 377 desirably overlies the first gate conductor layer 325. In one example, the first gate conductor layer may consist essentially of polycrystalline silicon ("polysilicon") and the second gate conductor layer may consist essentially of a low-resistance material such as a silicide. In another example, the first and second gate conductor layers may include first and second gate conductor layers each consisting essentially of polysilicon but having different dopant concentrations. In yet another example, one of the first and second gate conductor layers may include polysilicon and another one of the first and second gate conductor layers may include a metal or conductive compound of a metal. In still another example, each of the first and second gate conductor layers may include one or more metals or conductive compounds of metals.

Figure 5:
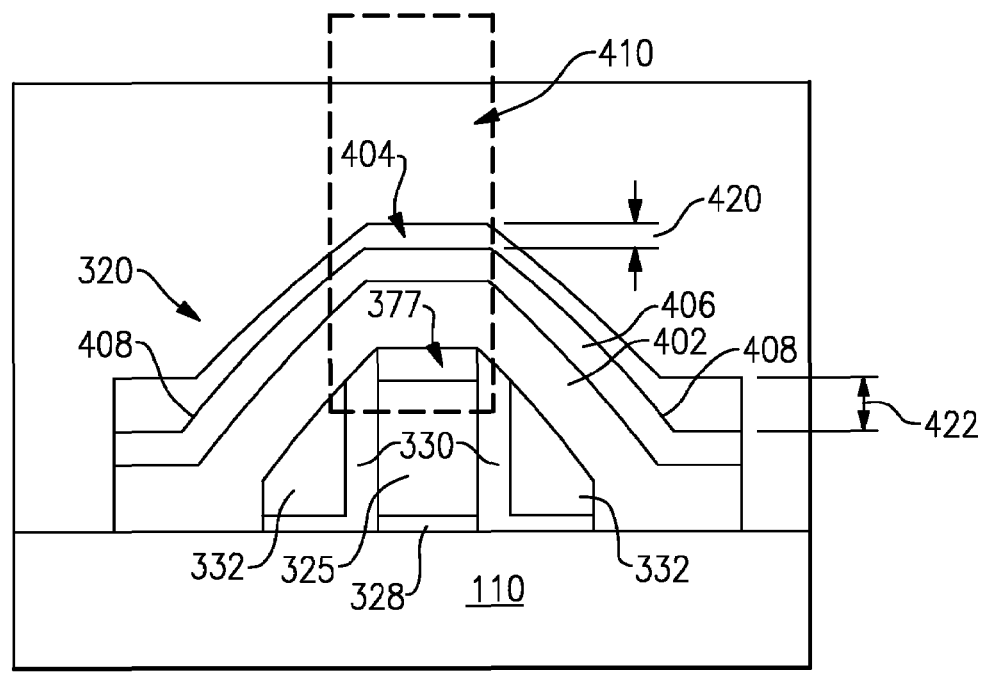
FIG. 5 is a sectional view illustrating a semiconductor device structure in accordance with an embodiment of the invention.

At the overlap region as further shown in FIG. 5, a series of dielectric layers lie atop the second gate conductor layer 377. The dielectric layers include a first stressed dielectric liner 402 overlying the gate stack 320, over which a conformal dielectric mask layer 406 is disposed. In one example, the dielectric mask layer 406 includes a layer of silicon oxide, which can be selectively preserved when a stressed dielectric liner including silicon nitride is patterned with an etchant. The silicon oxide mask layer is patternable using a different etchant which selectively preserves the stressed silicon nitride dielectric liner. A second stressed dielectric liner 404 overlies the dielectric mask layer 406. Typically, each of the stressed dielectric liners includes a layer of silicon nitride having an internal stress. For example, the stressed dielectric liner 402 may desirably include a layer of silicon nitride having an internal tensile stress. Desirably, such liner 402 overlies an active semiconductor region 432 in which an n-channel field effect transistor ("NFET") is provided. On the other hand, the stressed dielectric liner 404 may desirably include a layer of silicon nitride having an internal compressive stress. Desirably, such liner 404 overlies an active semiconductor region 434 in which a p-channel field effect transistor ("PFET") is provided. Each stressed dielectric liner is formed, for example, by high density plasma ("HDP") deposition techniques.

In accordance with an embodiment of the invention, a feature of the second stressed dielectric liner 404 is that it has substantially smaller thickness 420 where the liner 404 overlies the apex of the gate conductor 325 than at other locations where the liner 404 overlies the active semiconductor region 434, such as where the contact via 412 extends through the stressed dielectric liner 404. The smaller thickness of the second stressed dielectric liner 404 above the apex of the gate stack adds little to the overall thickness of the dielectric layers overlying the gate stack 320 where contact via 410 is to be formed. On the other hand, the greater thickness 422 of the second stressed dielectric liner 404 where the liner extends beyond rising edges 408 of the dielectric mask layer 406 is desirable for the second stressed dielectric liner to function in applying a beneficial stress to the active semiconductor region 434.

Desirably, the greater thickness 422 of the liner is at least about 1.5 times the smaller thickness 420. Even greater differences can be provided. For example, differences of 2.5 times or more promote the function of the stressed dielectric liner 404 overlying the active semiconductor region without hindering the fabrication of the contact via 410. Desirably, the greater thickness is more than about five times the smaller thickness of the liner. In one example, the smaller thickness 420 above the apex of the gate conductor may be about 500 angstroms and the greater thickness 422 may be about 1000 angstroms. In another example, the smaller thickness can be less than about 300 angstroms and the greater thickness can be greater than about 500 angstroms. In a particular example, the smaller thickness 420 above the apex of the gate conductor may be between about 100 angstroms and 300 angstroms and the greater thickness 422 may be between about 500 angstroms and 1000 angstroms. Thicknesses in between these examples can also be used, and thicknesses beyond the particular numbers provided here may also be used.

The novel stressed silicon nitride liner 404 can be formed by a high density plasma deposition ("HDP") process. In a particular example, the stressed silicon nitride liner can be formed using a 300 millimeter (mm) HDP chemical vapor deposition tool available from Novellus Systems, Inc. Argon, nitrogen or both can be used as sputtering source gases, with flow rates for each gas of between about 50 standard cubic centimeter per minute ("sccm") and about 500 sccm. During the sputtering process, the temperature of the substrate on which the active semiconductor regions are provided desirably is raised to a temperature above about 300 degrees C., for example at a temperature of between about 375 degrees C. and 440 degrees C. The gas pressure within the deposition chamber desirably is maintained at a value of less than about 50 mTorr, and may be maintained at a lower pressure such as below about 10 mTorr. The HDP tool may have both a low radio frequency generator and a high radio frequency (bias) power generator. The power setting for the low radio frequency generator desirably is set to a value between about 1500 and 4000 Watts. The power setting for the high radio frequency generator desirably is set to a value between about 200 Watts and about 3000 Watts. The high radio frequency generator may have a nominal frequency of about 13.56 MHz.

Particular examples follow are provided which are illustrative of embodiments of the invention but which are not intended to constrain the manner in which the invention is practiced. In the case of deposition onto a 200 millimeter substrate on which the active semiconductor regions 432, 434 are provided, the pressure may be set to a value of less than about 10 mTorr and the temperature of the substrate during the deposition may be a value such as between about 375 degrees C. and about 440 degrees C. Low radio frequency power may be set to a value of between about 1500 and about 2000 Watts and high radio frequency (bias) power may be set to a value between about 200 and 2000 Watts.

In the case of deposition onto a 300 millimeter substrate on which the active semiconductor regions 432, 434 are provided, the pressure may be set to a value of less than about 10 mTorr and the temperature of the substrate during the deposition may be a value such as between about 375 degrees C. and about 440 degrees C. Low radio frequency power may be set to a value of between about 3000 and about 4000 Watts and high radio frequency (bias) power may be set to a value between about 400 and 3000 Watts.

Once the gate stack and stressed dielectric liners 402 and 404 have been formed thereon as illustrated in FIGS. 4-5, a conductive contact via contacting the low-resistance layer 377 of the gate conductor stack can be formed by etching a contact hole as shown generally at 410 and then lining or filling the contact hole with conductive material, e.g., a metal, a conductive compound of a metal or both to form the conductive via.

Figure 3:
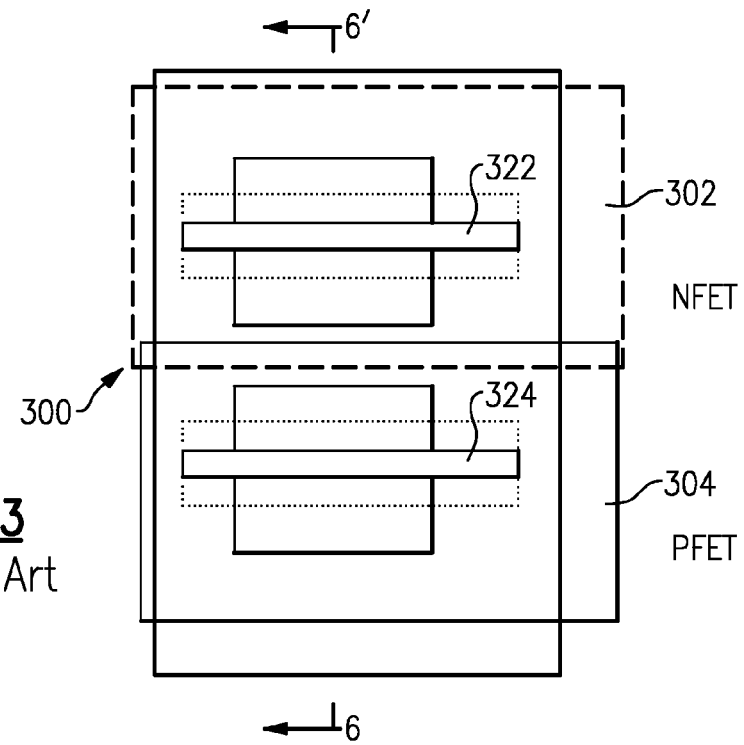
FIG. 3 is a plan view representative of both a prior art semiconductor device structure in accordance with an embodiment of the invention.
Figure 6:
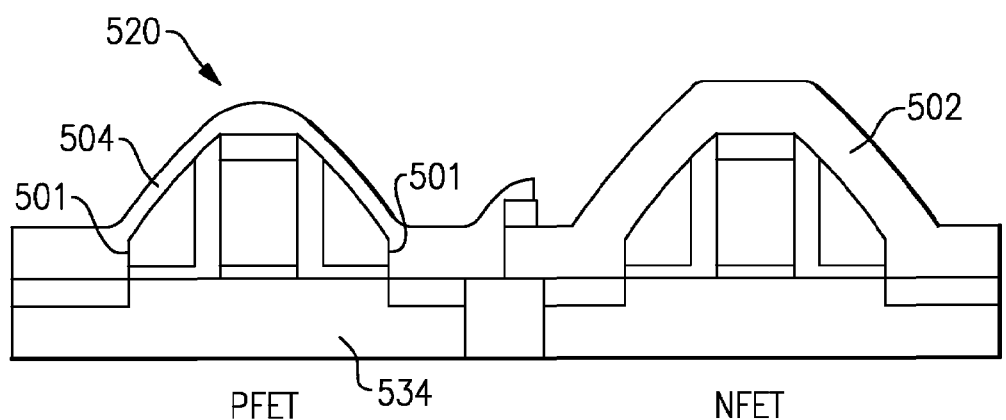
FIG. 6 is a sectional view illustrating a semiconductor device structure in accordance with another embodiment of the invention.

The embodiment of the invention illustrated in the sectional view of FIG. 6 corresponds to an orientation of gate conductors of adjacent PFET and NFET devices as illustrated in FIG. 3. As in the embodiment described with reference to FIGS. 4-5 above, the compressive stressed dielectric liner 504 overlying the PFET is thinner where it overlies the gate conductor than where the liner 504 extends over the active semiconductor region 534 beyond peripheral edges 501 of the gate conductor stack 520. By contrast, the tensile stressed dielectric liner 502 overlying the NFET has more uniform thickness, the tensile stressed liner having been formed by more conventional deposition techniques. For ease of reference, a method of fabricating the semiconductor device structure shown in FIGS. 4 and 5 will be described using views of the embodiment shown in FIG. 6.

Figure 7:
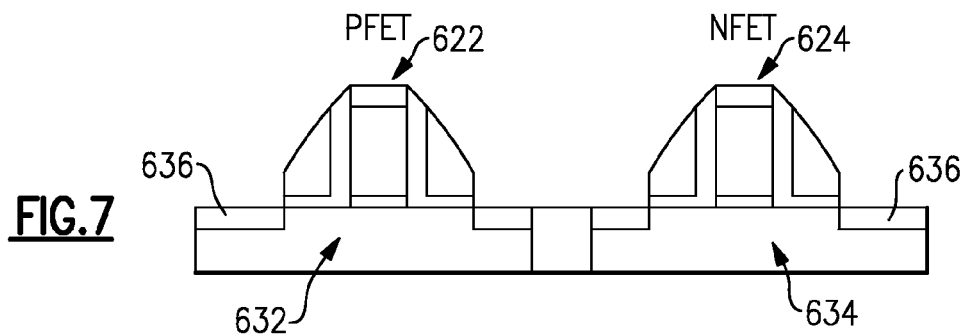
FIGS. 7 through 12B are sectional views illustrating stages in fabrication of the semiconductor device structure shown in FIG. 6.

Accordingly, FIG. 7 illustrates a stage of fabrication after gate conductor stacks 622, 624 for a PFET and an NFET have been formed, respectively. Each gate conductor stack includes a two- or more layer gate conductor, and dielectric spacers on walls thereof, as described above with reference to FIGS. 4 and 5. As further shown in FIG. 7, a trench isolation region separates the active semiconductor regions 632, 634 in which the PFET and NFET are provided. A low-resistance layer 636, e.g., a silicide region, may contact the source and drain regions of each transistor as well.

Figure 8:
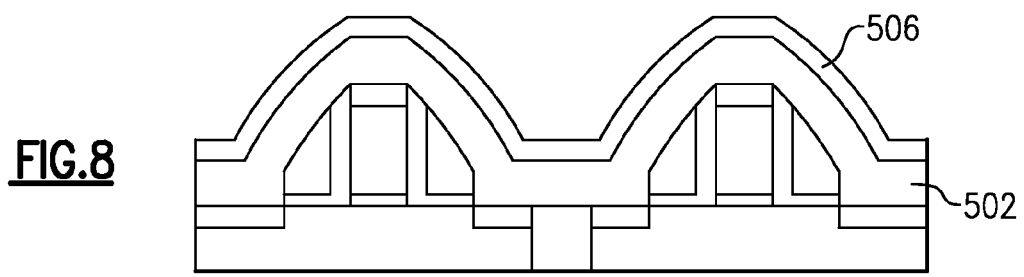

Then, as illustrated in FIG. 8, a first stressed dielectric liner 502, such as, for example, a tensile stressed silicon nitride layer, is deposited such that it covers both of the PFET and NFET devices. Subsequently, a conformal mask layer 506 then is deposited thereon. In a particular example, the conformal mask layer includes an oxide of silicon. Silicon oxide can be patterned using an etchant which does not attack silicon nitride. The reverse is also true such that the combination of layers 502, 506 permit patterning with good etch selectivity.

Figure 9:
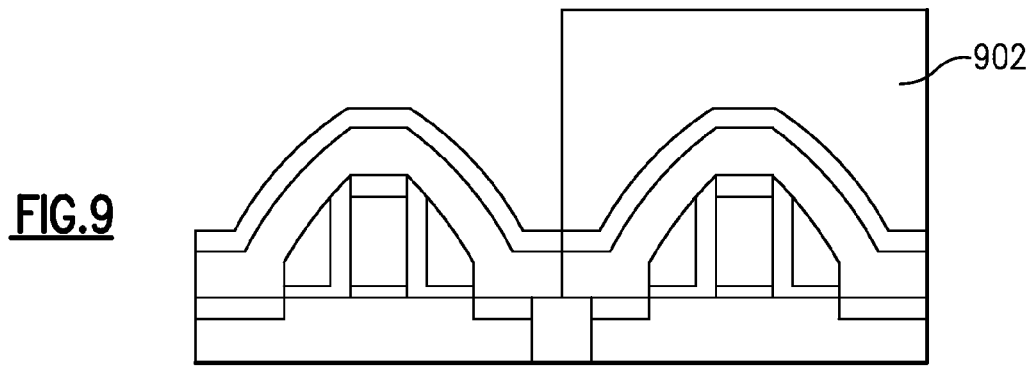
Figure 10:
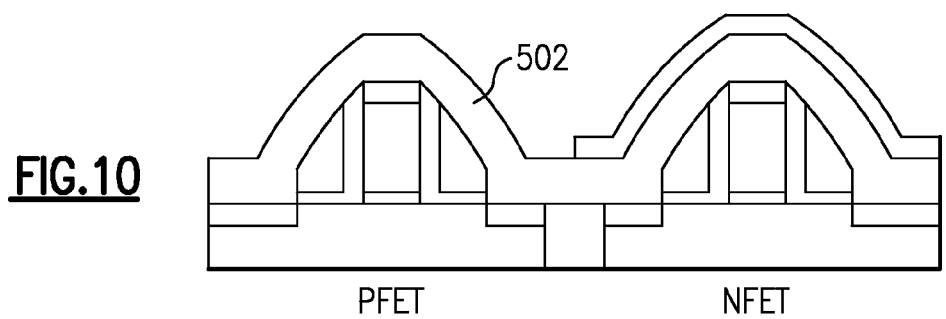
Figure 11:
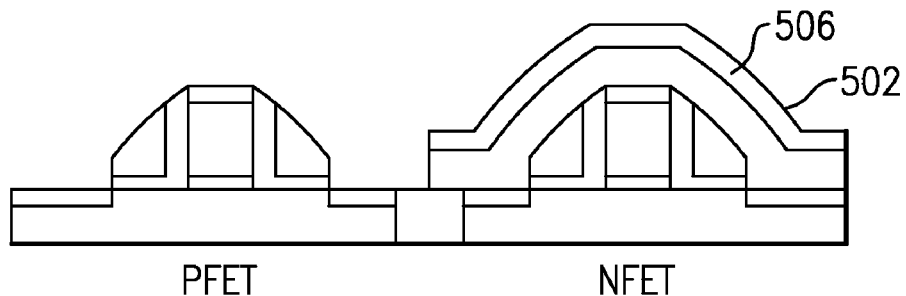

Thereafter, as illustrated in FIG. 9, a photoimageable layer is deposited to overlie the PFET and the NFET, after which the mask layer is photolithographically exposed and developed to form a patterned mask layer 902. In such manner, the PFET is exposed at the conclusion of this stage, while the NFET is covered by the patterned mask layer 902. Referring to FIG. 10, a portion of the conformal mask layer 506 overlying the PFET is removed, thus exposing the tensile stressed liner 502 underneath. The patterned photoimageable mask 902 (FIG. 9) then is removed, resulting in the structure as shown in FIG. 10. Referring to FIG. 11, a portion of the tensile stressed liner 502 then is removed where it overlies the PFET, such as by use of an etchant which selectively attacks silicon nitride while preserving the material of the mask layer 506, e.g., a material such as silicon oxide. At the conclusion of this stage of fabrication, the portion of the silicon nitride layer overlying the NFET is preserved due to the presence of the protective oxide mask layer 506.

Figure 12A:
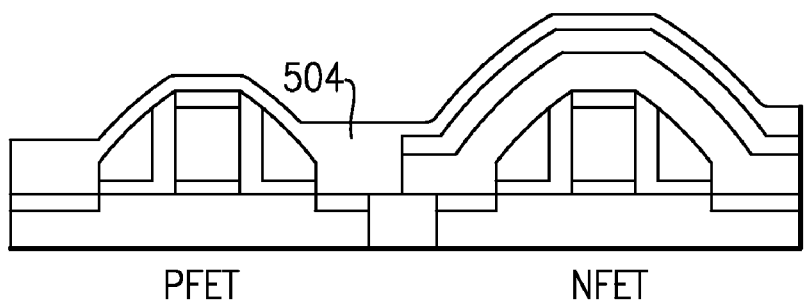
Figure 12B:
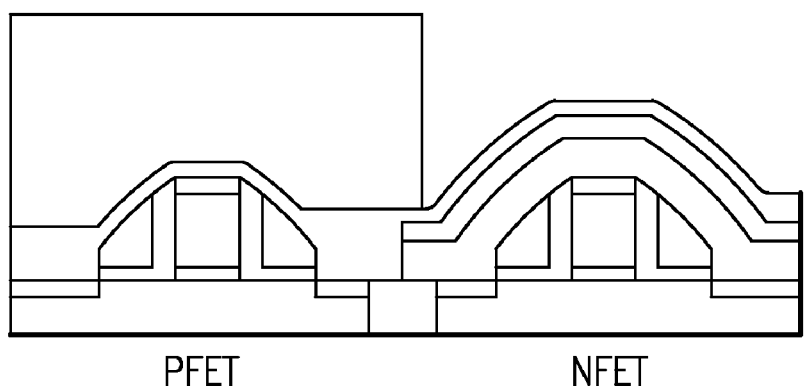

Thereafter, as illustrated in FIG. 12A, the second stressed dielectric liner 504, e.g., a compressive stressed dielectric liner then is deposited by techniques such as described above. Then, as shown in FIG. 12B, another photoimageable mask layer is deposited and patterned to expose a portion of the second stressed dielectric liner which overlies the NFET. The exposed portion of the second stressed dielectric liner 504 then is removed, using a selective etching process such as that described above with reference to FIG. 9 to produce a structure as shown in FIG. 6.

Figure 13A:
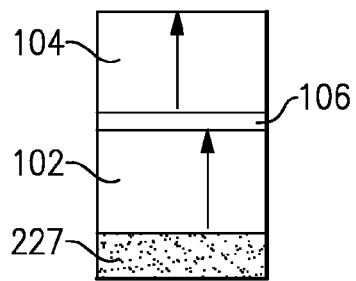
FIG. 13A through FIG. 15C are sectional views illustrating stages in the formation of contact holes to the semiconductor device structure in accordance with the prior art.
Figure 13B:
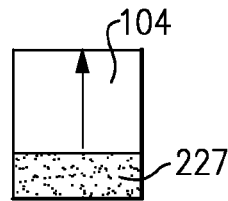
Figure 13C:
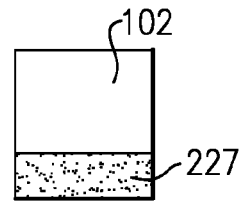

Referring to FIGS. 13A through 13C, illustrative examples of simultaneously etching conductive vias which extend through the stressed dielectric liners at the overlapped region will now be described.

Figure 14A:
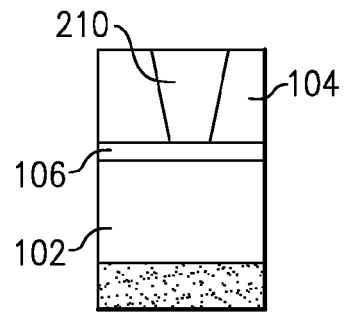
Figure 14B:
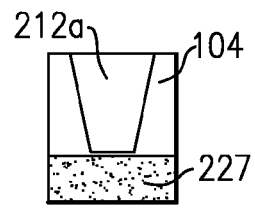
Figure 14C:
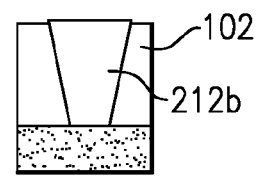

In an initial stage before contact holes are etched, the stressed dielectric liners 102, 104 are disposed overlying a silicide layer 227 at an overlapped region where the two liners are overlapped above the gate stack, with a conformal mask layer 106 between them (FIG. 13A). FIG. 13B illustrates a compressive stressed film 104 overlying a silicide layer 227 over an active semiconductor region of the PFET. FIG. 13C illustrates a tensile stressed film 102 overlying the silicide layer 227 over an active semiconductor region of the NFET. FIGS. 14A through 14C are corresponding sectional views illustrating an initial stage in a process of simultaneously etching contact holes 210, 212a through the compressive stressed liner 104 as shown in FIGS. 14A and 14B and etching a contact hole 212b through the tensile stressed liner 102 as shown in FIG. 14C. As shown in FIG. 14A, when simultaneously etching the contact holes 210, 212, the contact hole at the overlapped region merely reaches the mask layer 106 between the two stressed liners 102, 104. However, over the active semiconductor region of the PFET, the contact hole 212a already extends to the silicide region 227. Moreover, the same is also true where the contact hole 212b extends entirely through the stressed dielectric liner 102 overlying the active semiconductor region of the NFET (FIG. 14C).

Figure 15A:
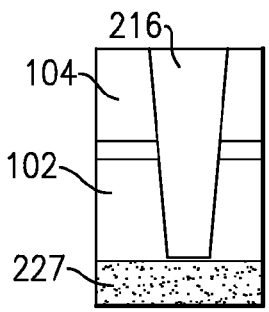
Figure 15B:
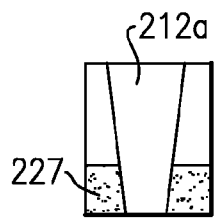
Figure 15C:
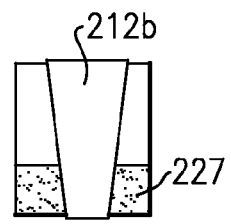

As further shown in FIG. 15A, later the greater thickness of the dielectric liner material at the overlapped region leads to a result that the contact hole 210 may just reach the silicide region 227. However, as a result of the process used to continue simultaneously etching the contact holes 212a and 212b over the PFET and NFET, respectively, those contact holes 212a, 212b extend entirely through not only the stressed dielectric liners 102, 104 but also the silicide region 227 underneath. As a result, the contact holes 212a, 212b may extend somewhat into the silicon of the source or drain regions of the PFET and NFET, a result which may increase contact resistance with respect to the conductive vias to be formed in the contact holes.

Referring now to FIGS. 16A to 16C, in an embodiment of the invention, the stressed dielectric liners 502, 504 are shown overlying a silicide layer 377 at an overlap region, an active semiconductor region of a PFET, and an active semiconductor region of an NFET, respectively. As illustrated in FIGS. 16B and 16C, the thickness of the stressed dielectric liner 502 overlying the NFET active semiconductor region is approximately the same as the thickness of the stressed dielectric liner 504 overlying the PFET.

At the stage of etching the structure as shown in FIG. 17A through FIG. 17C, the contact holes 410, 412a and 412b only extend somewhat into the stressed dielectric liners. Neither of the contact holes extends far enough yet at this stage to contact the silicide region 377. Then when the contact holes are extended further as shown in FIGS. 18A, 18B and 18C, each of the contact holes 410, 412a, and 412b extends to about the same depth from the major surface in each case. In this way, the thickness of the silicide layer under the contact holes desirably is not diminished or is hardly diminished. Thus, in the embodiment shown in FIGS. 18A through 18C, the contact hole 410 at the overlap region is etched sufficiently to reach the silicide layer 377 and simultaneously, the contact holes 412a and 412b are etched entirely through each stressed dielectric liner 502, 504, respectively to contact the silicide layer 377.

While the invention has been described with reference to certain preferred embodiments thereof, those skilled in the art will understand the many modifications and enhancements which can be made without departing from the true scope and spirit of the invention, which is limited only by the appended claims.

What is claimed is:

1. A semiconductor structure including a first semiconductor device in a first active semiconductor region and a second semiconductor device in a second active semiconductor region, the semiconductor structure including a first gate conductor of the first semiconductor device extending over the first active semiconductor region and a second gate conductor of the second semiconductor device having an end joined to an end of the first gate conductor, the second gate conductor extending over the second active semiconductor region, the semiconductor structure further comprising:

a first dielectric liner overlying the first semiconductor device;

a second dielectric liner overlying the second semiconductor device, the second dielectric liner overlapping the first dielectric liner, the second dielectric liner including a first portion having a first thickness where the second dielectric liner overlies an apex of the second gate conductor, and including a second portion extending from rising peripheral edges of dielectric spacers disposed on walls of the second gate conductor, the second portion having a second thickness substantially greater than the first thickness, wherein the first dielectric liner has a tensile stress to apply a tensile stress to a channel region of the first semiconductor device and the second dielectric liner has a compressive stress to apply a compressive stress to a channel region of the second semiconductor device;

a first conductive via contacting at least one of the first or second gate conductors, said conductive via extending through the first and second dielectric liners where the first and second dielectric liners are overlapped; and a second conductive via contacting at least one of a source region or a drain region of the second semiconductor device.

2. A semiconductor structure as claimed in claim 1, wherein the first semiconductor device includes an n-type field effect transistor ("NFET"), the second semiconductor device includes a p-type field effect transistor ("PFET").

3. A semiconductor structure as claimed in claim 1, wherein the first and second dielectric liners consist essentially of silicon nitride.

4. A semiconductor structure as claimed in claim 1, wherein the first dielectric liner contacts a conductive portion of the first semiconductor device beyond peripheral edges of the first gate conductor and the second dielectric liner contacts a conductive portion of the second semiconductor device beyond peripheral edges of the second gate conductor.

5. A semiconductor structure as claimed in claim 1, wherein the second thickness is at least 1.5 times the first thickness.

6. A semiconductor structure as claimed in claim 5, wherein the second thickness is more than 2.5 times the first thickness.

7. A semiconductor structure as claimed in claim 6, wherein the second thickness is more than five times the first thickness.

8. A semiconductor structure as claimed in claim 1, wherein the first thickness is less than about 300 angstroms and the second thickness is greater than about 500 angstroms.

9. A semiconductor structure as claimed in claim 8, wherein the first thickness is between about 100 angstroms and 300 angstroms and the second thickness is between about 500 angstroms and 1000 angstroms.

10. A semiconductor structure as claimed in claim 1, further comprising an intervening layer disposed between the first and second dielectric liners, wherein the first and second dielectric liners consist essentially of a first material and the intervening layer consists essentially of a second material different from the first material, wherein the first conductive via extends through the intervening layer.

11. A semiconductor structure as claimed in claim 10, wherein the first and second dielectric liners include silicon nitride and the intervening layer includes silicon oxide.

* * * * *